(12) United States Patent
Basker et al.

(10) Patent No.: US 8,946,791 B2
(45) Date of Patent: Feb. 3, 2015

(54) FINFET WITH REDUCED PARASITIC CAPACITANCE

(75) Inventors: Veeraraghavan S. Basker, Schenectady, NY (US); Effendi Leobandung, Wappingers Falls, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 13/600,314

(22) Filed: Aug. 31, 2012

(65) Prior Publication Data

US 2014/0061734 A1    Mar. 6, 2014

(51) Int. Cl.
*H01L 29/78*    (2006.01)
*H01L 21/336*    (2006.01)

(52) U.S. Cl.
USPC ............ 257/288; 257/E29.255; 257/E21.421; 438/283

(58) Field of Classification Search
CPC .................. H01L 21/823807; H01L 29/6659; H01L 29/7833; H01L 29/665; H01L 29/6656; H01L 29/66795; H01L 29/785; H01L 29/66772; H01L 29/78645; H01L 29/78648
USPC ............ 257/288, E29.255, E21.421; 438/283
See application file for complete search history.

(56) References Cited

U.S. PATENT DOCUMENTS

| | | | |
|---|---|---|---|
| 7,402,856 B2 | 7/2008 | Brask et al. | |
| 7,692,254 B2 | 4/2010 | Anderson et al. | |
| 8,043,920 B2 | 10/2011 | Chan et al. | |
| 8,358,012 B2 * | 1/2013 | Haran et al. | ................ 257/774 |
| 2011/0049583 A1 | 3/2011 | Lin et al. | |
| 2011/0079855 A1 | 4/2011 | Chan et al. | |
| 2011/0223736 A1 | 9/2011 | Lin et al. | |
| 2011/0303983 A1 | 12/2011 | Basker et al. | |
| 2012/0025316 A1 | 2/2012 | Schultz | |

OTHER PUBLICATIONS

Guillorn, M. et al., "FinFET performance advantage at 22nm: An AC perspective" Symposium on VLSI Technology (Jun. 17-19, 2008) pp. 12-13.

Warnock, J., "Circuit Design Challenges at the 14nm Technology Node" 48th ACM/EDAC/IEEE Design Automation Conference (DAC) (Jun. 5-9, 2011) pp. 464-467, vol. 26.3.

* cited by examiner

*Primary Examiner* — Matthew W Such
*Assistant Examiner* — Monica D Harrison
(74) *Attorney, Agent, or Firm* — Scully, Scott, Murphy & Presser, P.C.; Joseph P. Abate, Esq.

(57) ABSTRACT

A gate dielectric and a gate electrode are formed over a plurality of semiconductor fins. An inner gate spacer is formed and source/drain extension regions are epitaxially formed on physically exposed surface of the semiconductor fins as discrete components that are not merged. An outer gate spacer is subsequently formed. A merged source region and a merged drain region are formed on the source extension regions and the drain extension regions, respectively. The increased lateral spacing between the merged source/drain regions and the gate electrode through the outer gate spacer reduces parasitic capacitance for the fin field effect transistor.

20 Claims, 9 Drawing Sheets

FINFET WITH REDUCED PARASITIC CAPACITANCE

BACKGROUND

The present disclosure relates to a semiconductor structure, and more particularly to a semiconductor structure including dual gate spacers for laterally spacing merged source/drain regions from an inner gate spacer, and a method of manufacturing the same.

Fin field effect transistors increase the on-current per unit active area of a semiconductor chip by providing vertical channels on sidewalls of a semiconductor fin. For a fin field effect transistor including a plurality of semiconductor fins, merged source/drain regions are formed by selective epitaxy to electrically connect source/drain portions present in the plurality of semiconductor fins. The parasitic capacitance between the merged source/drain regions and the gate electrode increases the switching time for the fin field effect transistor.

SUMMARY

A gate dielectric and a gate electrode are formed over a plurality of semiconductor fins. An inner gate spacer is formed and source/drain extension regions are epitaxially formed on physically exposed surfaces of the semiconductor fins as discrete components that are not merged. An outer gate spacer is subsequently formed. A merged source region and a merged drain region are formed on the source extension regions and the drain extension regions, respectively. The increased lateral spacing between the merged source/drain regions and the gate electrode through the outer gate spacer reduces parasitic capacitance for the fin field effect transistor.

According to an aspect of the present disclosure, a semiconductor structure including a field effect transistor is provided. The field effect transistor includes a plurality of semiconductor fins located on an insulator layer. A body region is located within a portion of each semiconductor fin. The field effect transistor further includes a gate stack of a gate dielectric and a gate electrode straddling each body region; an inner gate spacer laterally surrounding the gate stack and including first and second outer sidewalls straddling the plurality of semiconductor fins; source extension regions located on the plurality of semiconductor fins and in greater proximity to the first outer sidewall than to the second outer sidewall; drain extension regions located on the plurality of semiconductor fins and in greater proximity to the second outer sidewall than to the first outer sidewall; an outer gate spacer laterally surrounding the inner gate spacer; a contiguous raised source region contacting each of the source extension regions; and a contiguous raised drain region contacting each of the drain extension regions.

According to another aspect of the present disclosure, a method of forming a semiconductor structure is provided. A plurality of semiconductor fins is formed on an insulator layer. A gate stack of a gate dielectric and a gate electrode are formed over portions of the plurality of semiconductor fins. An inner gate spacer is formed around the gate stack. First and second outer sidewalls of the inner gate spacer straddle the plurality of semiconductor fins. Source extension regions and drain extension regions are formed on the plurality of semiconductor fins. The source extension regions are formed in greater proximity to the first outer sidewall than to the second outer sidewall, and the drain extension regions are formed in greater proximity to the second outer sidewall than to the first outer sidewall. An outer gate spacer is formed around the inner gate spacer. A contiguous raised source region and a contiguous raised drain region are formed directly on the source extension regions and directly on the drain extension regions, respectively.

DETAILED DESCRIPTION

As stated above, the present disclosure relates to a semiconductor structure including dual gate spacers for laterally spacing merged source/drain regions from an inner gate spacer, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A-1D, an exemplary semiconductor structure according to an embodiment of the present disclosure includes a handle substrate 10, a buried insulator layer 20, and a plurality of semiconductor fins 30 on the buried insulator layer. The handle substrate 10 may comprise a semiconductor material, an insulator material, or a metallic material. In one embodiment, the handle substrate 10 comprises a semiconductor material, which may be single crystalline, polycrystalline, or amorphous. The buried insulator layer 20 includes a dielectric material such as silicon oxide, silicon nitride, and/or silicon oxynitride.

The plurality of semiconductor fins 30 includes a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary case, the semiconductor material comprises silicon. In one embodiment, the semiconductor material in each of the plurality of semiconductor fins 30 can be single crystalline.

The plurality of semiconductor fins 30 can be formed, for example, by patterning a single crystalline semiconductor layer. In one embodiment, the single crystalline semiconductor layer can be a top semiconductor layer within a semiconductor-on-insulator (SOI) substrate including a vertical stack of the handle substrate 10, the buried insulator layer 20, and the top semiconductor layer. For example, a patterned photoresist layer can be formed over the top semiconductor layer of the SOI substrate and the top semiconductor layer can be patterned into the plurality of semiconductor fins 30 by transferring the pattern in the patterned photoresist layer with an anisotropic etch. Dielectric fin caps (not shown) having the same horizontal cross-sectional area as an underlying semiconductor fin 30 may be optionally formed on the top surface of each semiconductor fin 30.

In one embodiment, the plurality of semiconductor fins 30 may be doped with p-type dopants or n-type dopants. If the plurality of semiconductor fins 30 is doped, the type of doping of the plurality of semiconductor fins 30 is herein referred to as a first conductivity type. The electrical dopants may be at least one of p-type dopants such as B, Ga, and In. Alternately, the electrical dopants may be at least one of n-type dopants such as P, As, and Sb. The concentration of the electrical dopants (p-type dopants or n-type dopants) in the plurality of semiconductor fins 30 may be from $1.0 \times 10^{15}$ atoms/cm$^3$ to $1.0 \times 10^{19}$ atoms/cm$^3$, although lesser and greater concentrations can also be employed. Non-electrical stress-generating dopants such as Ge and/or C may also be present in the plurality of semiconductor fins 30 in some embodiments.

The height of the plurality of semiconductor fins can be from 20 nm to 300 nm, although greater and lesser thicknesses can also be employed. The width of each semiconductor fin 30 along the horizontal direction included in the vertical plane B-B' can be from 3 nm to 100 nm, although lesser and greater widths can also be employed. The length of each semiconductor fin 30 along the direction perpendicular to the vertical plane B-B' can be from 60 nm to 1,000 nm, although lesser and greater lengths can also be employed.

Referring to FIGS. 2A-2D, a gate dielectric 50 and a gate electrode 52 are formed over a middle portion of each semiconductor fin 30 by deposition and patterning of a gate dielectric layer and a gate conductor layers. The gate dielectric layer can be formed conformally on the surfaces of the plurality of semiconductor fins 30.

In one embodiment, the gate dielectric layer can include a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the gate dielectric layer can be formed only on physically exposed surfaces of the plurality of semiconductor fin 30.

Alternately or additionally, the gate dielectric layer may include a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x can be independently from about 0.5 to about 3 and each value of y can be independently from 0 to about 2.

Optionally, an interfacial layer (not shown), for example, silicon oxide, can be formed by chemical oxidation or thermal oxidation before the high-k dielectric material is deposited.

The gate conductor layer can be deposited on the gate dielectric layer, for example, by chemical vapor deposition (CVD). The gate conductor layer may comprise a doped semiconductor material or a metallic material. Non-limiting examples of the semiconductor materials include amorphous silicon, polysilicon, an amorphous silicon germanium alloy, or a polycrystalline silicon germanium alloy. Non-limiting examples of metallic materials include W, Ta, TiN, ZrN, HfN, VN, NbN, TaN, WN, TiAlN, TaC, TaMgC, TaCN, other conductive refractory metal nitrides, and an alloy thereof. The gate conductor layer may be formed by chemical vapor deposition (CVD), physical vapor deposition (PVD), atomic layer deposition (ALD), vacuum evaporation, etc. In one embodiment, the thickness of the gate conductor layer may be from 20 nm to 300 nm.

The stack of the gate dielectric layer and the gate conductor layer can be lithographically patterned by application and patterning of a photoresist material, and by transfer of the pattern in the photoresist material into the stack of the gate dielectric layer and the gate conductor layer employing an anisotropic etch. Employing the patterned photoresist as an etch mask, the anisotropic etch can remove the physically exposed portions of the gate conductor layer selective to the gate dielectric layer. The exposed portions of the gate dielectric layer can subsequently be removed selective to the semiconductor material of the plurality of semiconductor fins 30. The remaining portions of the gate conductor layer and the gate dielectric layer constitute the gate electrode 52 and the gate dielectric 50, respectively. The gate dielectric 50 and the gate electrode 52 constitute a gate stack (50, 52).

Referring to FIGS. 3A-3D, an inner gate spacer 54 is formed on the sidewalls of the gate electrode 52. The inner gate spacer 54 includes a dielectric material such as silicon oxide, silicon nitride, silicon oxynitride, a dielectric metal oxide, a dielectric metal nitride, a dielectric metal oxynitride, or combinations thereof. The inner gate spacer 54 contacts the top surface of the buried insulator layer 20.

The inner gate spacer 54 can be formed, for example, by conformal deposition of a dielectric material layer and removal of horizontal portions of the dielectric material layer by an anisotropic etch. In one embodiment, the inner gate spacer 54 can be formed by a conformal deposition of a silicon oxide layer or a silicon nitride layer by chemical vapor deposition (CVD) and by an anisotropic etch that removes the horizontal portions of the conformally deposited silicon oxide layer or silicon nitride layer. The lateral thickness of the inner gate spacer 54 (i.e., the lateral distance between an inner sidewall of the inner gate spacer 54 and the most proximate outer sidewall of the inner gate spacer 54) can be from 1 nm to 30 nm, although lesser and greater thicknesses can also be employed.

Figure 1A:
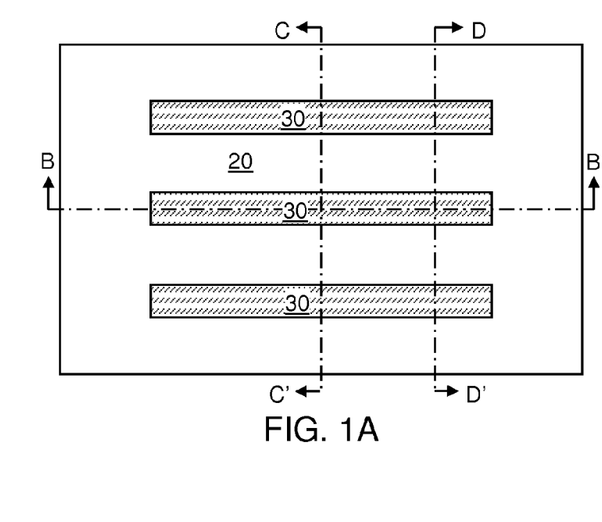
FIG. 1A is a top-down view of an exemplary semiconductor structure after formation of a plurality of semiconductor fins according to an embodiment of the present disclosure.
Figure 1B:
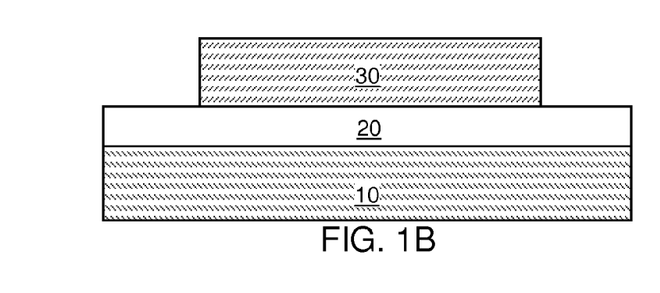
FIG. 1B is a vertical cross-sectional view of the exemplary semiconductor structure along the vertical plane B-B' in FIG. 1A.
Figure 1C:
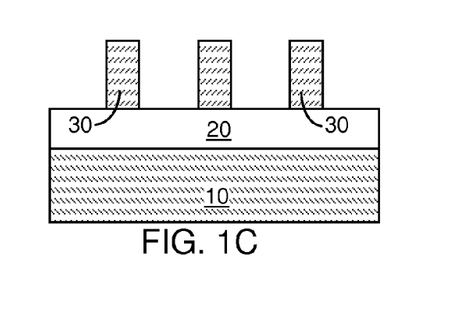
FIG. 1C is a vertical cross-sectional view of the exemplary semiconductor structure along the vertical plane C-C' in FIG. 1A.
Figure 1D:
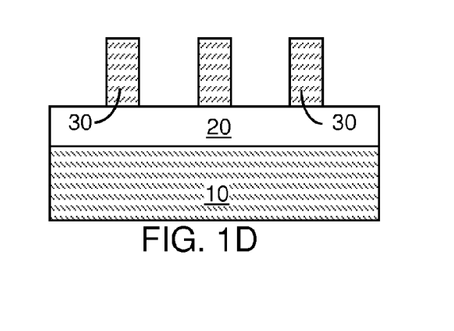
FIG. 1D is a vertical cross-sectional view of the exemplary semiconductor structure along the vertical plane D-C' in FIG. 1A.
Figure 2A:
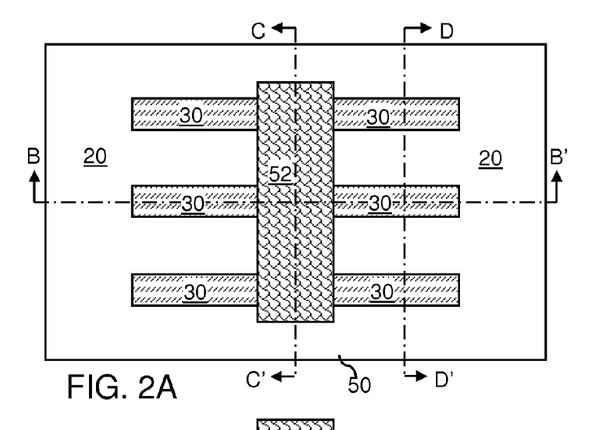
FIG. 2A is a top-down view of the exemplary semiconductor structure after formation of a gate dielectric and a gate electrode according to an embodiment of the present disclosure.
Figure 2B:
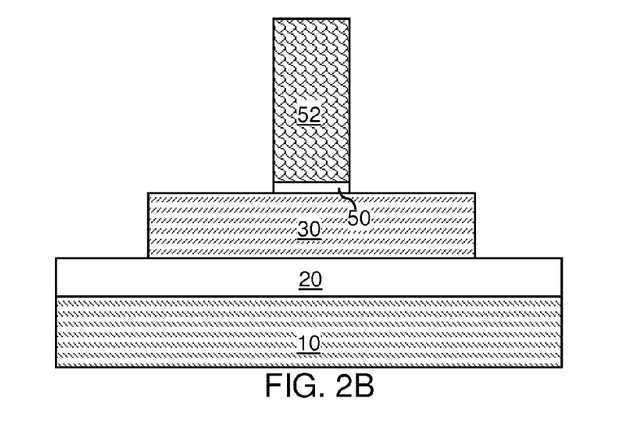
FIG. 2B is a vertical cross-sectional view of the exemplary semiconductor structure along the vertical plane B-B' in FIG. 2A.
Figure 2C:
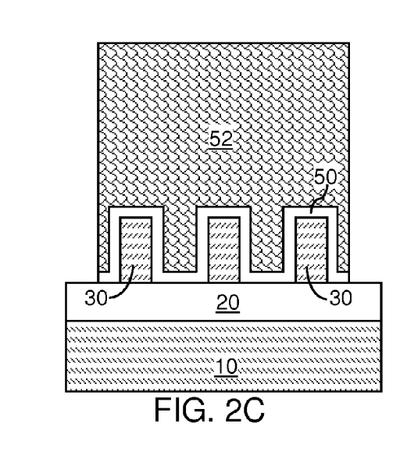
FIG. 2C is a vertical cross-sectional view of the exemplary semiconductor structure along the vertical plane C-C' in FIG. 2A.
Figure 2D:
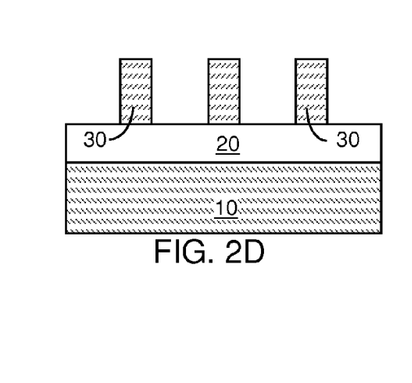
FIG. 2D is a vertical cross-sectional view of the exemplary semiconductor structure along the vertical plane D-D' in FIG. 2A.
Figure 3A:
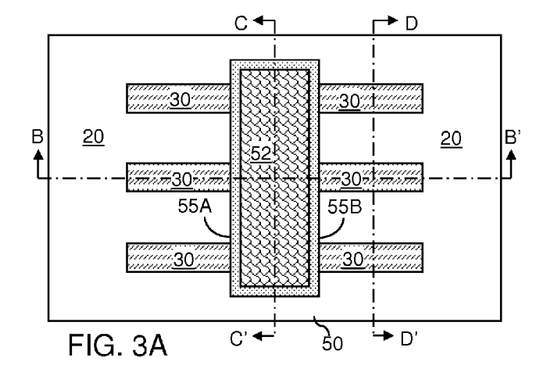
FIG. 3A is a top-down view of the exemplary semiconductor structure after formation of an inner gate spacer according to an embodiment of the present disclosure.
Figure 3B:
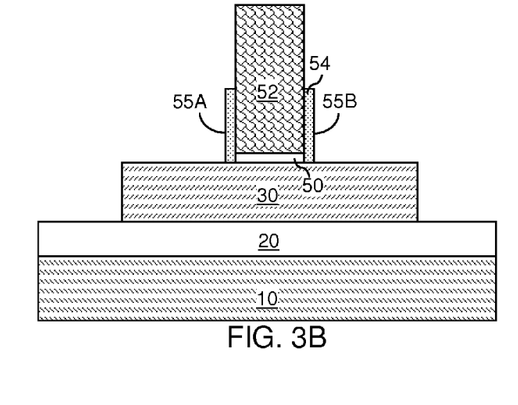
FIG. 3B is a vertical cross-sectional view of the exemplary semiconductor structure along the vertical plane B-B' in FIG. 3A.
Figure 3C:
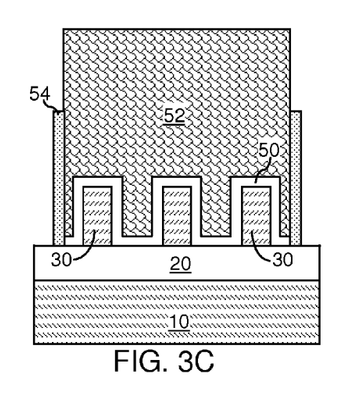
FIG. 3C is a vertical cross-sectional view of the exemplary semiconductor structure along the vertical plane C-C' in FIG. 3A.
Figure 3D:
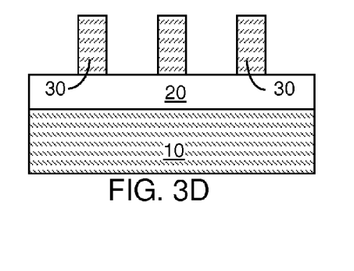
FIG. 3D is a vertical cross-sectional view of the exemplary semiconductor structure along the vertical plane D-D' in FIG. 3A.
Figure 4A:
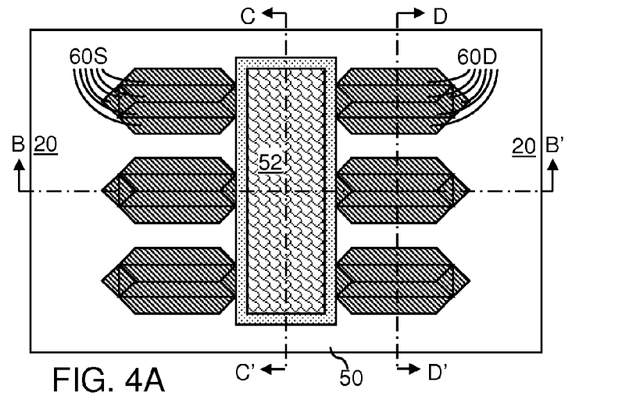
FIG. 4A is a top-down view of the exemplary semiconductor structure after formation of source extension regions and drain extension regions according to an embodiment of the present disclosure.
Figure 4B:
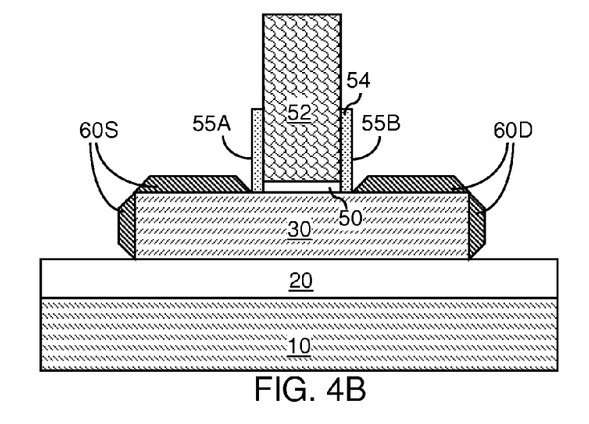
FIG. 4B is a vertical cross-sectional view of the exemplary semiconductor structure along the vertical plane B-B' in FIG. 4A.
Figure 4C:
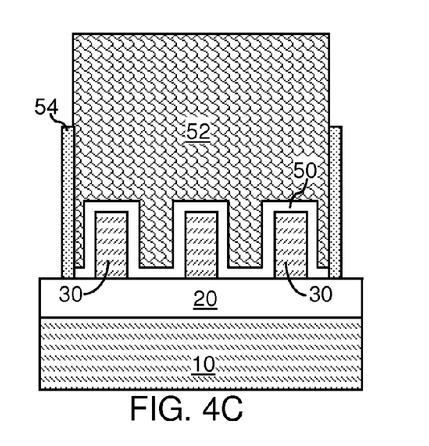
FIG. 4C is a vertical cross-sectional view of the exemplary semiconductor structure along the vertical plane C-C' in FIG. 4A.
Figure 4D:
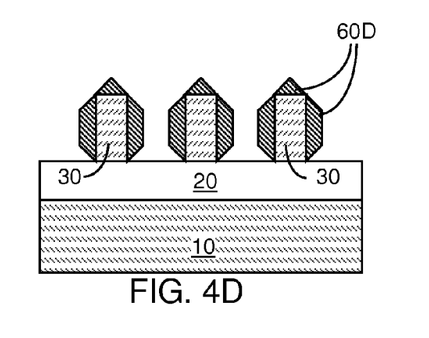
FIG. 4D is a vertical cross-sectional view of the exemplary semiconductor structure along the vertical plane D-D' in FIG. 4A.

The inner gate spacer 54 includes a first outer sidewall 55A that is physically exposed, is located at one side (e.g., the left side as seen in FIGS. 3A and 3B) of the gate electrode 52, and straddles the plurality of semiconductor fins 30, and a second outer sidewall 55B that is physically exposed, is located at the other side (e.g., the right side as seen in FIGS. 3A and 3B) of the gate electrode 52, and straddles the plurality of semiconductor fins 30. The first outer sidewall 55A and the second outer sidewall 55B of the inner gate spacer 54 can be vertical.

Referring to FIGS. 4A-4D, source extension regions 60S and drain extension regions 60D are formed on the plurality of semiconductor fins 30. The source extension regions 60S are formed in greater proximity to the first outer sidewall 55A than to the second outer sidewall 55B of the inner gate spacer 54, and the drain extension regions 60D are formed in greater proximity to the second outer sidewall 55B than to the first outer sidewall 55A of the inner gate spacer 54.

The source extension regions 60S and the drain extension regions 60D can be formed, for example, by selective epitaxy of a semiconductor material. Each of the source extension regions 60S and the drain extension regions 60D can include a single crystalline semiconductor material that is epitaxially aligned to the underlying semiconductor material, which is the semiconductor material of a semiconductor fin 30. As used herein, "epitaxial" alignment refers to alignment of atoms in a same singe crystalline structure. The semiconductor material of the source extension regions 60S and the drain extension regions 60D can be the same as, or different from, the semiconductor material of the plurality of semiconductor fins 30.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the surfaces of the plurality of semiconductor fins 30 is the difference between the deposition rate of a semiconductor material due to the reactant gas less the etch rate of the semiconductor material due to the etchant gas. The selective epitaxy process does not deposit any semiconductor material on dielectric surfaces such as the surfaces of the inner gate spacer 54 and the surface of the buried insulator layer 20 because any semiconductor material that nucleates on the dielectric surfaces is etched by the etchant gas before a contiguous layer of a deposited semiconductor material can be formed on the dielectric surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, the source extension regions 60S and the drain extension regions 60D can be formed with in-situ doping so that the source extension regions 60S and the drain extension regions 60D are doped with electrical dopants during the selective epitaxy. The source extension regions 60S and the drain extension regions 60D can be doped with electrical dopants of a second conductivity type, which is the opposite of the first conductivity type. For example, if the first conductivity type (which is the conductivity type of the plurality of semiconductor fins 30) is p-type, the second conductivity type is n-type, and vice versa.

Alternately, the source extension regions 60S and the drain extension regions 60D can be formed without doping so that the source extension regions 60S and the drain extension regions 60D are formed as intrinsic semiconductor material portions. In this case, electrical dopants can be introduced into the source extension regions 60S and the drain extension regions 60D in a subsequent processing step.

The source extension regions 60S can be formed on all top surfaces and sidewall surfaces of the plurality of semiconductor fins 30 that are located farther away from the gate stack (50, 52) than the first outer sidewall 55A. The drain extension regions 60D can be formed on all top surfaces and sidewall surfaces of the plurality of semiconductor fins 30 that are located farther away from the gate stack (50, 52) than the second outer sidewall 55B.

In one embodiment, each surface of the source extension regions 60S and the drain extension regions 60D can be formed as crystallographic facets. In this case, the dielectric material of the inner gate spacer 54 can retard, or suppress, formation of a surface of the source extension regions 60S or the drain extension regions 60D that is parallel to the first and second outer sidewalls (55A, 55B) of the inner gate spacer 54. Thus, the source extension regions 60S and the drain extension regions 60D that contact the inner gate spacer 54 can be formed at an orientation that is not parallel to the first and second outer sidewalls (55A, 55B) of the inner gate spacer 54. In this case, each surface of the source extension regions 60S and the drain extension regions 60D that contact the inner gate spacer 54 is not parallel to the first and second outer sidewalls (55A, 55B) of the inner gate spacer 54. The area of contact between the source and drain extension regions (60S, 60D) and the inner gate spacer 54 can be zero. In other words, any contact between the first and second outer sidewalls (55A, 55B) of the inner gate spacer 54 and the source and drain extension regions (60S, 60D) can be along a one-dimensional line of an edge of a crystallographic facet.

Further, the source extension regions 60S and the drain extension regions 60D that are formed on the end surfaces of the plurality of semiconductor fins 30 that are parallel to the vertical plane B-B' can be formed with crystallographic facets such that two crystallographic facets merge along a vertical line on each end surface of the plurality of semiconductor fins 30. In this case, all surfaces of the source extension regions 60S and the drain extension regions 60D can be formed at orientations that are at a non-zero angle with respect to the first and second outer sidewalls (55A, 55B) of the inner gate spacer 54.

In one embodiment, the source extension regions 60S can contact all top surfaces and sidewall surfaces of the plurality of semiconductor fins that are located farther away from the gate stack (50, 52) than the first outer sidewall 55A of the inner gate spacer 54. Further, the drain extension regions 60D can contact all top surfaces and sidewall surfaces of the plurality of semiconductor fins 30 that are located farther away from the gate stack (50, 52) than the second outer sidewall 55B of the inner gate spacer 54.

Referring to FIGS. 5A-5D, an outer gate spacer 56 is formed on the outer sidewalls of the inner gate spacer 54 and on proximal portions of the source extension regions 60S and the drain extension regions 60D. As used herein, a "proximal" portion refers to a portion that is proximate to the gate stack (50, 52), and a "distal" portion refers to a portion that is distal from the gate stack (50, 52). The outer gate spacer 56 includes a dielectric material such as silicon oxide, silicon nitride, silicon oxynitride, a dielectric metal oxide, a dielectric metal nitride, a dielectric metal oxynitride, or combinations thereof. The outer gate spacer 56 contacts the top surface of the buried insulator layer 20.

The outer gate spacer 56 can be formed, for example, by conformal deposition of a dielectric material layer and removal of horizontal portions of the dielectric material layer by an anisotropic etch. In one embodiment, the outer gate spacer 56 can be formed by a conformal deposition of a silicon oxide layer or a silicon nitride layer by chemical vapor deposition (CVD) and by an anisotropic etch that removes the horizontal portions of the conformally deposited silicon oxide layer or silicon nitride layer. The lateral thickness of the outer gate spacer 56 (i.e., the lateral distance between an inner sidewall of the outer gate spacer 56 and the most proximate outer sidewall of the outer gate spacer 56) can be from 5 nm to 100 nm, although lesser and greater thicknesses can also be employed.

Figure 5A:
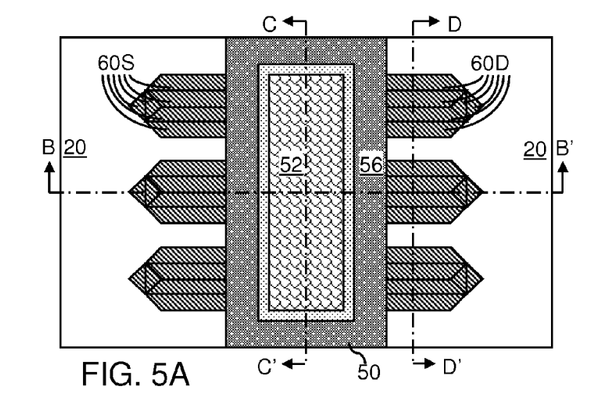
FIG. 5A is a top-down view of the exemplary semiconductor structure after formation of an outer gate spacer according to an embodiment of the present disclosure.
Figure 5B:
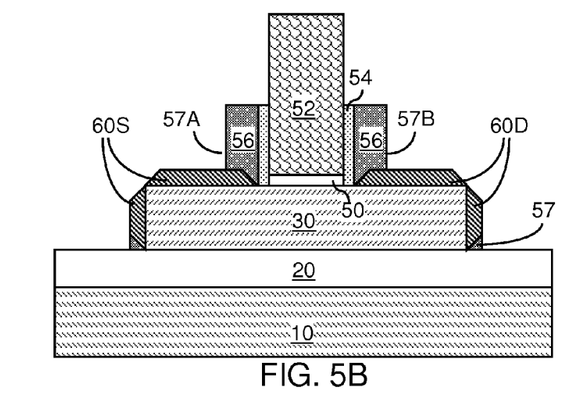
FIG. 5B is a vertical cross-sectional view of the exemplary semiconductor structure along the vertical plane B-B' in FIG. 5A.
Figure 5C:
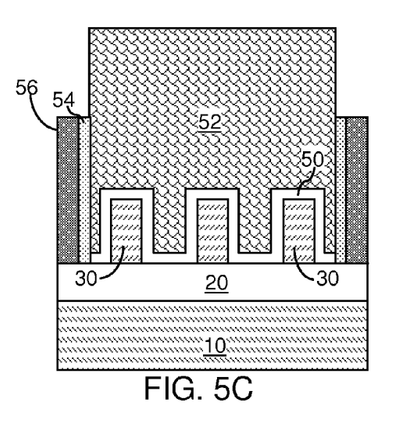
FIG. 5C is a vertical cross-sectional view of the exemplary semiconductor structure along the vertical plane C-C' in FIG. 5A.
Figure 5D:
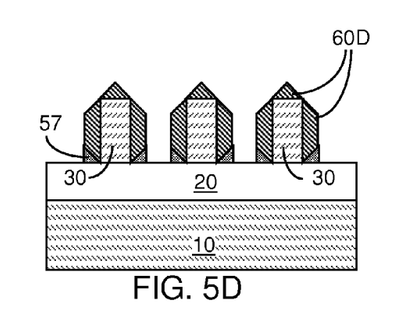
FIG. 5D is a vertical cross-sectional view of the exemplary semiconductor structure along the vertical plane D-D' in FIG. 5A.
Figure 6A:
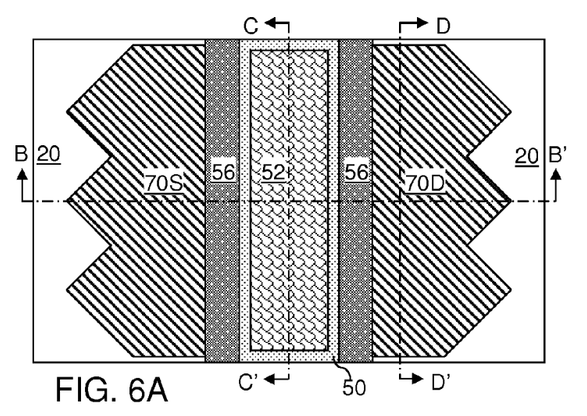
FIG. 6A is a top-down view of the exemplary semiconductor structure after formation of a contiguous raised source region and a contiguous raised drain region according to an embodiment of the present disclosure.
Figure 6B:
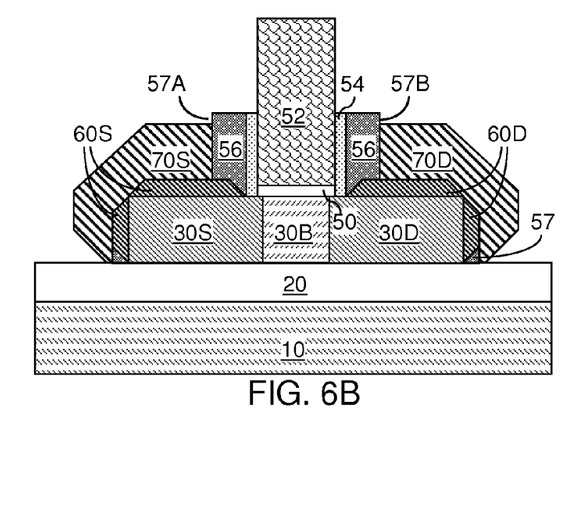
FIG. 6B is a vertical cross-sectional view of the exemplary semiconductor structure along the vertical plane B-B' in FIG. 6A.
Figure 6C:
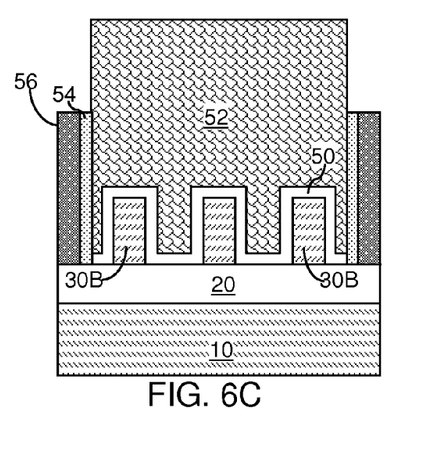
FIG. 6C is a vertical cross-sectional view of the exemplary semiconductor structure along the vertical plane C-C' in FIG. 6A.
Figure 6D:
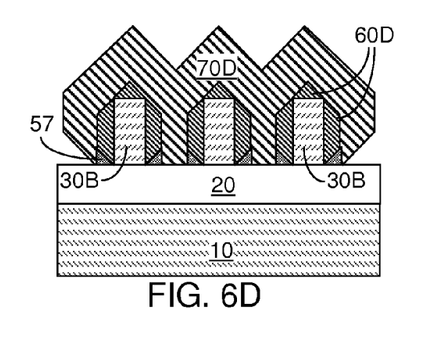
FIG. 6D is a vertical cross-sectional view of the exemplary semiconductor structure along the vertical plane D-D' in FIG. 6A.
Figure 7A:
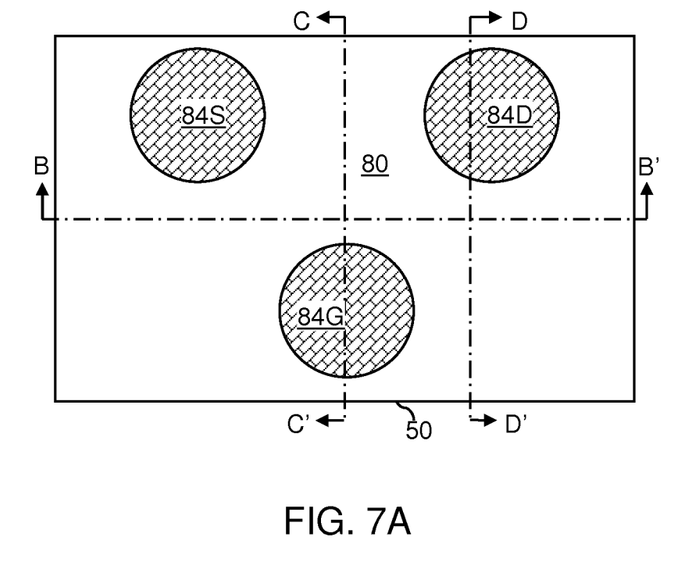
FIG. 7A is a top-down view of the exemplary semiconductor structure after formation of a contact-level dielectric layer, metal semiconductor ally regions, and contact via structures according to an embodiment of the present disclosure.
Figure 7B:
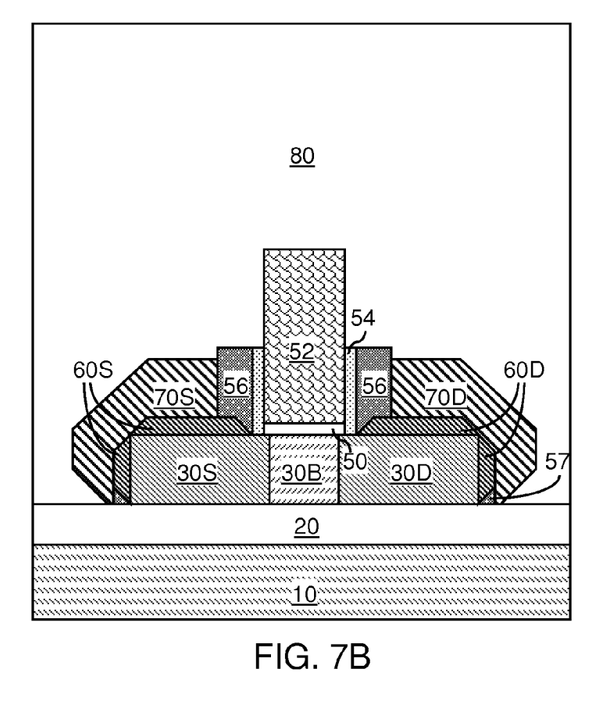
FIG. 7B is a vertical cross-sectional view of the exemplary semiconductor structure along the vertical plane B-B' in FIG. 7A.
Figure 7C:
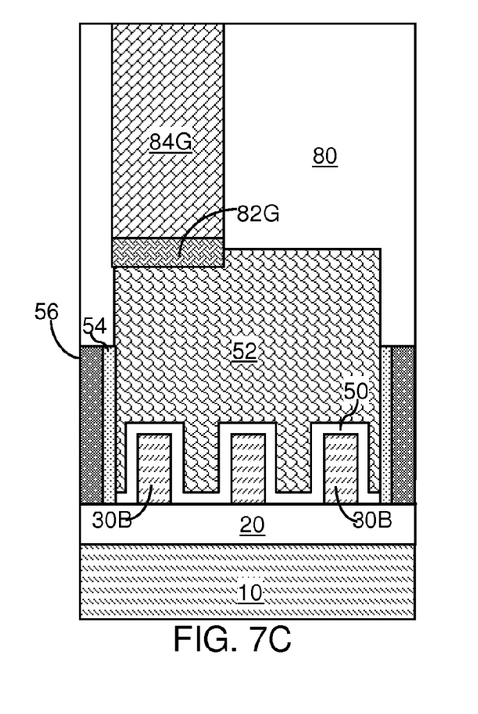
FIG. 7C is a vertical cross-sectional view of the exemplary semiconductor structure along the vertical plane C-C' in FIG. 7A.
Figure 7D:
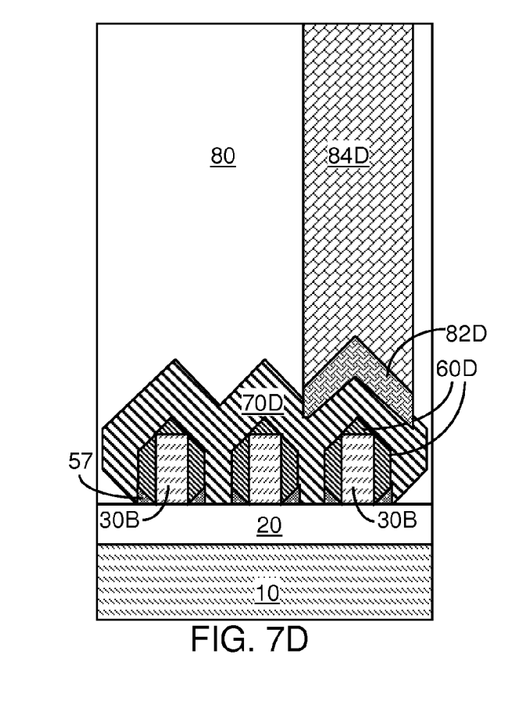
FIG. 7D is a vertical cross-sectional view of the exemplary semiconductor structure along the vertical plane D-D' in FIG. 7A.

The outer gate spacer 56 includes a first outer sidewall 57A that is physically exposed, is located at one side (e.g., the left side as seen in FIGS. 5A and 5B) of the gate stack (50, 52), and straddles the plurality of semiconductor fins 30, and a second outer sidewall 57B that is physically exposed, is located at the other side (e.g., the right side as seen in FIGS. 5A and 5B) of the gate stack (50, 52), and straddles the plurality of semiconductor fins 30. The first outer sidewall 57A and the second outer sidewall 57B of the outer gate spacer 56 can be vertical, i.e., can be a first outer vertical sidewall and a second outer vertical sidewall, respectively.

Referring to FIGS. 6A-6D, a contiguous raised source region 70S and a contiguous raised source region 7D are formed. The contiguous raised source region 70S is contiguous throughout the entirety thereof, and is formed directly on the source extension regions 60S. The contiguous raised drain region 70D is contiguous throughout the entirety thereof, and is formed directly on the drain extension regions 60D. All surfaces of the source extension regions 60S can be contacted by the outer gate spacer 56 and the contiguous raised source region 70S upon formation of the continuous raised source region 70S. Further, all surfaces of the drain extension regions 60D can be contacted by the outer gate spacer 56 and the contiguous raised drain region 70D upon formation of the continuous raised drain region 70D. The contiguous raised source region 70S and the contiguous raised drain region 70D fill all remaining spaces among the plurality of semiconductor fins 30.

The contiguous raised source region 70S and the contiguous raised drain region 70D can be formed, for example, by selective epitaxy of a semiconductor material. Each of the contiguous raised source region 70S and the contiguous raised drain region 70D can include a single crystalline semiconductor material that is epitaxially aligned to an underlying semiconductor material portion, which is one of the source extension regions 60S and the drain extension regions 60D. The semiconductor material of the contiguous raised source region 70S and the contiguous raised drain region 70D can be the same as, or different from, the semiconductor material of the source extension regions 60S and the drain extension regions 60D. Further, the semiconductor material of the contiguous raised source region 70S and the contiguous raised drain region 70D can be the same as, or different from, the semiconductor material of the plurality of semiconductor fins 30.

The exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the surfaces of the source extension regions 60S and the drain extension regions 60D is the difference between the deposition rate of a semiconductor material due to the reactant gas less the etch rate of the semiconductor material due to the etchant gas. The selective epitaxy process does not deposit any semiconductor material on dielectric surfaces such as the surfaces of the outer gate spacer 56 and the surface of the buried insulator layer 20 because any semiconductor material that nucleates on the dielectric surfaces is etched by the etchant gas before a contiguous layer of a deposited semiconductor material can be formed on the dielectric surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, the contiguous raised source region 70S and the contiguous raised drain region 70D can be formed with in-situ doping so that the contiguous raised source region 70S and the contiguous raised drain region 70D are doped with electrical dopants during the selective epitaxy. The contiguous raised source region 70S and the contiguous raised drain region 70D can be doped with electrical dopants of the second conductivity type, which is the opposite of the first conductivity type.

Alternately, the contiguous raised source region 70S and the contiguous raised drain region 70D can be formed without doping so that the contiguous raised source region 70S and the contiguous raised drain region 70D are formed as intrinsic semiconductor material portions. In this case, dopants of the second conductivity type are introduced into the contiguous raised source region 70S and the contiguous raised drain region 70D by ion implantation or plasma doping.

The contiguous raised source region 70S can be formed on all physically exposed surfaces, which are crystallographic facets, of the source extension regions 60S and the drain extension regions 60D. Thus, the contiguous raised source region 70S can be formed on all outer surfaces of the source extension regions 60S that are located farther away from the gate stack (50, 52) than the first outer sidewall 57A of the outer spacer 56. The contiguous raised drain region 70D can be formed on all outer surfaces of the drain extension regions 60D that are located farther away from the gate stack (50, 52) than the second outer sidewall 57B of the outer spacer 56. In one embodiment, the contiguous raised source region 70S can contact the first outer sidewall 57A of the outer gate spacer 56, and the contiguous raised drain region 70D can contact the second outer sidewall 57B of the outer gate spacer 56. In one embodiment, some surfaces of the contiguous raised source region 70S and the contiguous raised drain region 70D can be formed as crystallographic facets.

Electrical dopants of the second conductivity type provided in the contiguous raised source region 70S and the contiguous raised drain region 70D and optionally in the source and drain extension regions (60S, 60D) can diffuse into end portions of each semiconductor fin to form fin source portions 30S and fin drain portions 30D during the selective epitaxy of the contiguous raised source region 70S and the contiguous raised drain region 70D and/or during an anneal at an elevated temperature that is performed after the selective epitaxy of the contiguous raised source region 70S and the contiguous raised drain region 70D. The portions of the plurality of semiconductor fins 30 that have the doping of the first conductivity type constitute body regions 30B, which include channels of a field effect transistor and collectively function as a body node of the field effect transistor. The fin source regions 30S, the source extension regions 60S, and the contiguous raised source region 70S collectively function as a source node of the field effect transistor. The fin drain regions 30D, the drain extension regions 60D, and the contiguous raised drain region 70D collectively function as a drain node of the field effect transistor.

The exemplary semiconductor structure includes the plurality of semiconductor fins 30 located on the insulator layer 20. A body region 30B is located within a portion of each semiconductor fin (30B, 30S, 30D). The gate stack (50, 52) of the gate dielectric 50 and the gate electrode 52 straddles the plurality of body regions 30B. The inner gate spacer 54 laterally surrounding the gate stack (50, 52) and includes first and second outer sidewalls (55A, 55B; See FIGS. 4A and 4B) straddling the plurality of semiconductor fins (30B, 30S, 30D). The source extension regions 60S are located on the plurality of semiconductor fins (30B, 30S, 30D) and in greater proximity to the first outer sidewall 55A than to the second outer sidewall 55B. The drain extension regions 60D are located on the plurality of semiconductor fins (30B, 30S, 30D) and in greater proximity to the second outer sidewall 55B than to the first outer sidewall 55A. The outer gate spacer 56 laterally surrounds the inner gate spacer 54. The contiguous raised source region 70S contacts each of the source extension regions 60S. The contiguous raised drain region 70D contacts each of the drain extension regions 60D.

Each of the contiguous raised source region 70S and the contiguous raised drain region 70D is laterally spaced from the gate stack (50, 52) by a sum of the lateral thickness of the inner gate spacer 54 and the lateral thickness of the outer gate spacer 56. Each of the plurality of semiconductor fins (30B, 30S, 30D) can be laterally spaced from one another by at least one portion of the contiguous raised source region 70S and by at least one portion of the contiguous raised drain region 70D. In one embodiment, the outer gate spacer 56 can include a first outer vertical sidewall (such as the first outer sidewall 57A) that adjoins the insulator layer 20 and contacts a vertical sidewall of the contiguous raised source region 70S. The outer gate spacer 56 can further include a second outer vertical sidewall (such as the second outer sidewall 57B) that adjoins the insulator layer 20 and contacts a vertical sidewall of the contiguous raised drain region 70D.

Referring to FIGS. 7A-7D, a contact-level dielectric layer 80 is deposited over the plurality of semiconductor fins (30B, 30S, 30D), the gate stack (50, 52), the source and drain extension regions (60S, 60D), the contiguous raised source region 70S, and the contiguous raised drain region 70D. The contact-level dielectric layer 80 includes a dielectric material such as silicon oxide, silicon nitride, porous or non-porous organosilicate glass (OSG), and/or any other dielectric material that can be employed to form an electrically insulating layer in a metal interconnect structure. Contact via holes are formed through the contact-level dielectric layer 80, and filled with a conductive material to form various contact via structures. The various contact via structures can include, for example, a source contact via structure 84S, a drain contact via structure 84D, and a gate contact via structure 84G. Optionally, a metal semiconductor alloy regions such as a metal silicide can be formed at the bottom of each contact via hole prior to formation of the various contact via structures. The metal semiconductor alloy regions can include, for example, a source metal semiconductor alloy region (not shown) formed on the contiguous raised source region 70S and underneath the source contact via structure 84S, a drain metal semiconductor alloy region 82D formed on the contiguous raised drain region 70D and underneath the drain contact via structure 84D, and a gate metal semiconductor alloy region 82G formed on the gate electrode 52 and underneath the gate contact via structure 84G.

The use of two selective epitaxial processes enable formation of the contiguous raised source region 70S and the contiguous raised drain region 70D with a greater lateral offset from the gate electrode 52 than lateral offset between the gate electrode 52 and the source and drain extension regions (60S, 60D). The thickness of the inner gate spacer 54 can be selected to enable formation of the p-n junctions between the body region 30B and each of the fin source region 30S and the fin drain region 30D in each semiconductor fin (30B, 30S, 30D) at desired locations relative to the interface between the gate electrode 52 and the inner gate spacer 54. The thickness of the outer gate spacer 56 can be selected to optimize the resistance of the source node (30S, 60S<70S) and the drain node (30D, 60D, 70D) and the parasitic capacitance between the gate electrode 52 and each of the source node (30S, 60S<70S) and the drain node (30D, 60D, 70D).

The contiguous raised source region 70S and the contiguous raised drain region 70D are laterally spaced from the gate electrode 52 by the sum of the lateral thicknesses of the inner gate spacer 54 and the outer gate spacer 56. Thus, the parasitic capacitance between the gate electrode 52 and each of the contiguous raised source region 70S and the contiguous raised drain region 70D can be reduced relative to comparative exemplary structure including a field effect transistor that does not employ the combination of a first epitaxy process for forming source and drain extension regions (60S, 60D), formation of an outer gate spacer 56 after the first epitaxy process and prior to a second epitaxy process, and the second epitaxy process for forming the contiguous raised source region 70S and the contiguous raised drain region 70D.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising a field effect transistor, said field effect transistor comprising:
   a plurality of semiconductor fins located on an insulator layer, wherein a body region is located within a portion of each semiconductor fin;
   a gate stack of a gate dielectric and a gate electrode straddling each of said body regions;
   an inner gate spacer laterally surrounding said gate stack and including first and second outer sidewalls straddling said plurality of semiconductor fins;
   source extension regions located on said plurality of semiconductor fins and in greater proximity to said first outer sidewall than to said second outer sidewall;
   drain extension regions located on said plurality of semiconductor fins and in greater proximity to said second outer sidewall than to said first outer sidewall;
   an outer gate spacer laterally surrounding said inner gate spacer;
   a contiguous raised source region contacting each of said source extension regions; and
   a contiguous raised drain region contacting each of said drain extension regions, wherein said source extension regions contact all top surfaces and sidewall surfaces of said plurality of semiconductor fins that are located farther away from said gate stack than said first outer sidewall.

2. The semiconductor structure of claim 1, wherein said drain extension regions contact all top surfaces and sidewall surfaces of said plurality of semiconductor fins that are located farther away from said gate stack than said second outer sidewall.

3. The semiconductor structure of claim 1, wherein said outer gate spacer comprises first and second outer sidewalls straddling said plurality of semiconductor fins.

4. The semiconductor structure of claim 3, wherein said outer gate spacer and said contiguous raised source region contact all surfaces of said source extension regions.

5. The semiconductor structure of claim 4, wherein said outer gate spacer and said contiguous raised drain region contact all surfaces of said drain extension regions.

6. The semiconductor structure of claim 1, wherein all surfaces of said source extension regions and said drain extension regions are at a non-zero angle with respect to said first and second outer sidewalls of said inner gate spacer.

7. The semiconductor structure of claim 1, wherein each of said plurality of semiconductor fins is laterally spaced from one another by at least one portion of said contiguous raised source region and by at least one portion of said contiguous raised drain region.

8. The semiconductor structure of claim 1, wherein each of said contiguous raised source region and said contiguous raised drain region is laterally spaced from said gate stack by a sum of a lateral thickness of said inner gate spacer and a lateral thickness of said outer gate spacer.

9. The semiconductor structure of claim 1, wherein said outer gate spacer comprises a first outer vertical sidewall that adjoins said insulator layer and contacts a vertical sidewall of said contiguous raised source region, and said outer gate spacer comprises a second outer vertical sidewall that adjoins said insulator layer and contacts a vertical sidewall of said contiguous raised drain region.

10. A semiconductor structure comprising a field effect transistor, said field effect transistor comprising:
    a plurality of semiconductor fins located on an insulator layer, wherein a body region is located within a portion of each semiconductor fin;
    a gate stack of a gate dielectric and a gate electrode straddling each of said body regions;
    an inner gate spacer laterally surrounding said gate stack and including first and second outer sidewalls straddling said plurality of semiconductor fins;
    source extension regions located on said plurality of semiconductor fins and in greater proximity to said first outer sidewall than to said second outer sidewall;
    drain extension regions located on said plurality of semiconductor fins and in greater proximity to said second outer sidewall than to said first outer sidewall;
    an outer gate spacer laterally surrounding said inner gate spacer;
    a contiguous raised source region contacting each of said source extension regions; and
    a contiguous raised drain region contacting each of said drain extension regions, wherein each surface of said source extension regions and said drain extension regions that contacts said inner gate spacer is not parallel to said first and second outer sidewalls of said inner gate spacer.

11. The semiconductor structure of claim 10, wherein said source extension regions contact all top surfaces and sidewall surfaces of said plurality of semiconductor fins that are located farther away from said gate stack than said first outer sidewall.

12. A method of forming a semiconductor structure comprising:
    forming a plurality of semiconductor fins on an insulator layer;
    forming a gate stack of a gate dielectric and a gate electrode over portions of said plurality of semiconductor fins;
    forming an inner gate spacer around said gate stack, wherein first and second outer sidewalls of said inner gate spacer straddle said plurality of semiconductor fins;
    forming source extension regions and drain extension regions on said plurality of semiconductor fins, wherein said source extension regions are formed in greater proximity to said first outer sidewall than to said second outer sidewall, and said drain extension regions are formed in greater proximity to said second outer sidewall than to said first outer sidewall;
    forming an outer gate spacer around said inner gate spacer; and forming a contiguous raised source region directly on said source extension regions and a contiguous raised drain region directly on said drain extension regions, wherein said source extension regions are formed on all top surfaces and sidewall surfaces of said plurality of semiconductor fins that are located farther away from said gate stack than said first outer sidewall.

13. The method of claim 12, wherein said drain extension regions are formed on all top surfaces and sidewall surfaces of said plurality of semiconductor fins that are located farther away from said gate stack than said second outer sidewall.

14. The method of claim 12, wherein first and second outer sidewalls of said outer gate spacer straddle said plurality of semiconductor fins.

15. The method of claim 14, wherein all surfaces of said source extension regions are contacted by said outer gate spacer and said contiguous raised source region upon formation of said continuous raised source region.

16. The method of claim 15, wherein all surfaces of said drain extension regions are contacted by said outer gate spacer and said contiguous raised drain region upon formation of said continuous raised drain region.

17. The method of claim 12, wherein all surfaces of said source extension regions and said drain extension regions are formed at orientations that are at a non-zero angle with respect to said first and second outer sidewalls of said inner gate spacer.

18. The method of claim 12, wherein said contiguous raised source region and said contiguous raised drain region fill spaces among said plurality of semiconductor fins.

19. A method of forming a semiconductor structure comprising:
   forming a plurality of semiconductor fins on an insulator layer;
   forming a gate stack of a gate dielectric and a gate electrode over portions of said plurality of semiconductor fins;
   forming an inner gate spacer around said gate stack, wherein first and second outer sidewalls of said inner gate spacer straddle said plurality of semiconductor fins;
   forming source extension regions and drain extension regions on said plurality of semiconductor fins, wherein said source extension regions are formed in greater proximity to said first outer sidewall than to said second outer sidewall, and said drain extension regions are formed in greater proximity to said second outer sidewall than to said first outer sidewall, wherein each surface of said source extension regions and said drain extension regions that contacts said inner gate spacer is formed at an orientation that is not parallel to said first and second outer sidewalls of said inner gate spacer;
   forming an outer gate spacer around said inner gate spacer; and
   forming a contiguous raised source region directly on said source extension regions and a contiguous raised drain region directly on said drain extension regions.

20. The method of claim 19, wherein said source extension regions are formed on all top surfaces and sidewall surfaces of said plurality of semiconductor fins that are located farther away from said gate stack than said first outer sidewall.

* * * * *